United States Patent
Motwani et al.

(10) Patent No.: US 10,223,201 B2
(45) Date of Patent: Mar. 5, 2019

(54) METHOD OF STORING ENCODED DATA SLICES USING A DISTRIBUTED AGREEMENT PROTOCOL

(71) Applicant: International Business Machines Corporation, Armonk, NY (US)

(72) Inventors: Manish Motwani, Chicago, IL (US); Jason K. Resch, Chicago, IL (US); Ilya Volvovski, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 283 days.

(21) Appl. No.: 15/194,946

(22) Filed: Jun. 28, 2016

(65) Prior Publication Data

US 2017/0006104 A1 Jan. 5, 2017

Related U.S. Application Data

(60) Provisional application No. 62/186,590, filed on Jun. 30, 2015.

(51) Int. Cl.
*G06F 15/16* (2006.01)
*G06F 11/10* (2006.01)
(Continued)

(52) U.S. Cl.
CPC .......... *G06F 11/1076* (2013.01); *G06F 3/064* (2013.01); *G06F 3/065* (2013.01);
(Continued)

(58) Field of Classification Search
CPC .... G06F 11/1076; G06F 3/0619; G06F 3/064; G06F 3/065; H04L 65/4076; H04L 67/06; H04L 67/1095
(Continued)

(56) References Cited

U.S. PATENT DOCUMENTS

| | | |
|---|---|---|
| 4,092,732 A | 5/1978 | Ouchi |
| 5,454,101 A | 9/1995 | Mackay et al. |

(Continued)

OTHER PUBLICATIONS

Shamir; How to Share a Secret; Communications of the ACM; vol. 22, No. 11; Nov. 1979; pp. 612-613.
(Continued)

*Primary Examiner* — Alan S Chou
(74) *Attorney, Agent, or Firm* — Garlick & Markison; Timothy W. Markison; Randy W. Lacasse

(57) ABSTRACT

A method includes encoding a data object in accordance with dispersed storage error encoding parameters to produce sets of encoded data slices having sets of slice names. The dispersed storage error encoding parameters includes a pillar width number of encoded data slices. The data object is associated with a unique source name and each slice name includes a reference to the unique source name. The method further includes executing a distributed agreement protocol using the unique source name and coefficients regarding a plurality of storage units of the dispersed storage network (DSN) to produce a ranking of the plurality of storage units. The method further includes identifying the pillar width number of storage units of the plurality of storage units based on the ranking of the storage units. The method further includes sending the plurality of sets of encoded data slices to the pillar width number of storage units for storage therein.

12 Claims, 9 Drawing Sheets

(51) Int. Cl.

| | | |
|---|---|---|
| *G06F 3/06* | (2006.01) | |
| *G06F 11/16* | (2006.01) | |
| *G06F 17/30* | (2006.01) | |
| *H03M 13/33* | (2006.01) | |
| *H04L 29/08* | (2006.01) | |
| *H04L 29/06* | (2006.01) | |
| *H03M 13/37* | (2006.01) | |
| *H03M 13/15* | (2006.01) | |

(52) U.S. Cl.
CPC ............ *G06F 3/067* (2013.01); *G06F 3/0619* (2013.01); *G06F 11/1662* (2013.01); *G06F 17/3053* (2013.01); *G06F 17/30312* (2013.01); *G06F 17/30545* (2013.01); *G06F 17/30575* (2013.01); *G06F 17/30578* (2013.01); *H03M 13/33* (2013.01); *H03M 13/3761* (2013.01); *H04L 65/4076* (2013.01); *H04L 67/06* (2013.01); *H04L 67/1095* (2013.01); *H04L 67/1097* (2013.01); *H04L 67/16* (2013.01); *G06F 2201/805* (2013.01); *H03M 13/1515* (2013.01)

(58) Field of Classification Search
USPC ........................................................ 709/219
See application file for complete search history.

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma et al. |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula, Jr. |
| 2005/0132070 A1 | 6/2005 | Redlich et al. |
| 2005/0144382 A1 | 6/2005 | Schmisseur |
| 2005/0229069 A1 | 10/2005 | Hassner |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll, Jr. |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters, III et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2013/0232503 A1* | 9/2013 | Volvovski ........... G06F 11/1044 718/104 |
| 2013/0238900 A1* | 9/2013 | Leggette ............ H04L 63/0428 713/165 |
| 2014/0115388 A1* | 4/2014 | Grube .................. G06F 9/4401 714/15 |
| 2014/0122925 A1* | 5/2014 | Peake ..................... G06F 11/10 714/6.24 |
| 2015/0378625 A1* | 12/2015 | Resch .................. G06F 3/0616 711/114 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

(56) References Cited

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 1511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

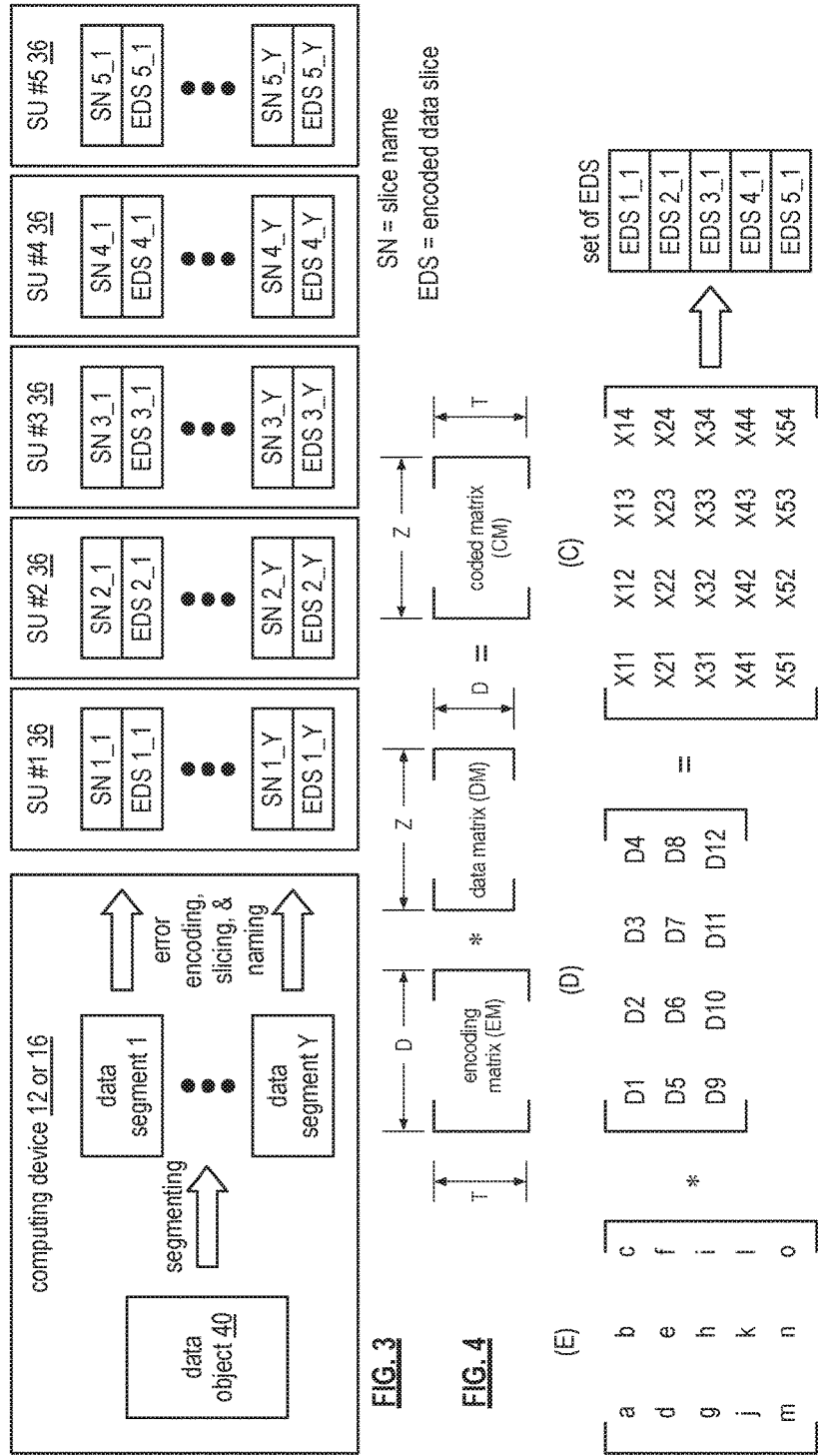

METHOD OF STORING ENCODED DATA SLICES USING A DISTRIBUTED AGREEMENT PROTOCOL

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

In dispersed storage systems maintaining a directory and/or file system is a challenge. In particular, the encoding and distribution of data needs to be recorded for accurate retrieval of the data. It is faster and easier to have the directory and/or file system in a single shared location. Faster because the data of the directory and/or file system is readily available and easier to make changes to a centralized version than a distributed version. Having the directory and/or file system in a single location creates a single point of failure and thus undermines one or more values of dispersed storage systems. As such, most dispersed storage system encoded and disperse store the directory and/or file system.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
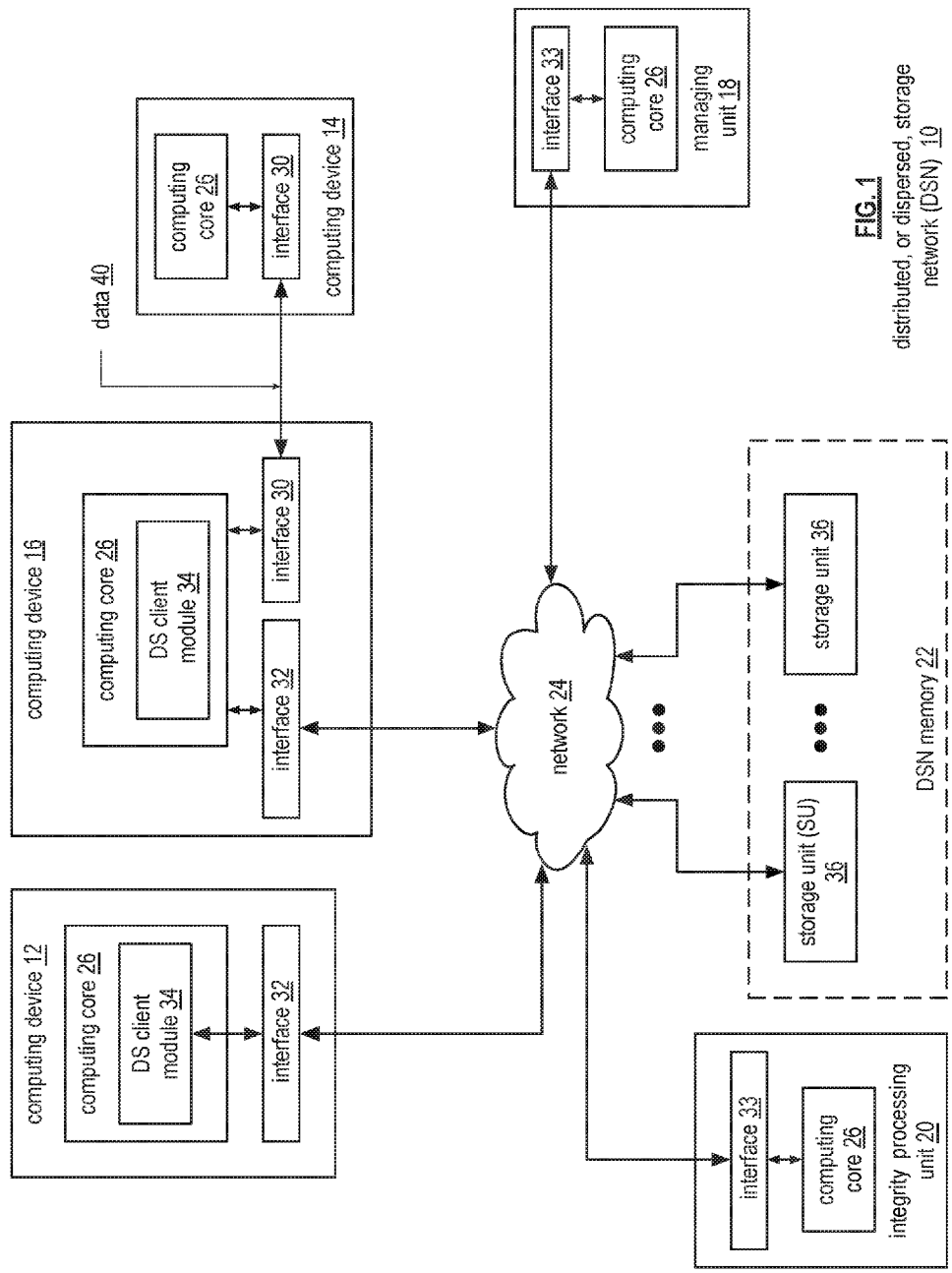
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
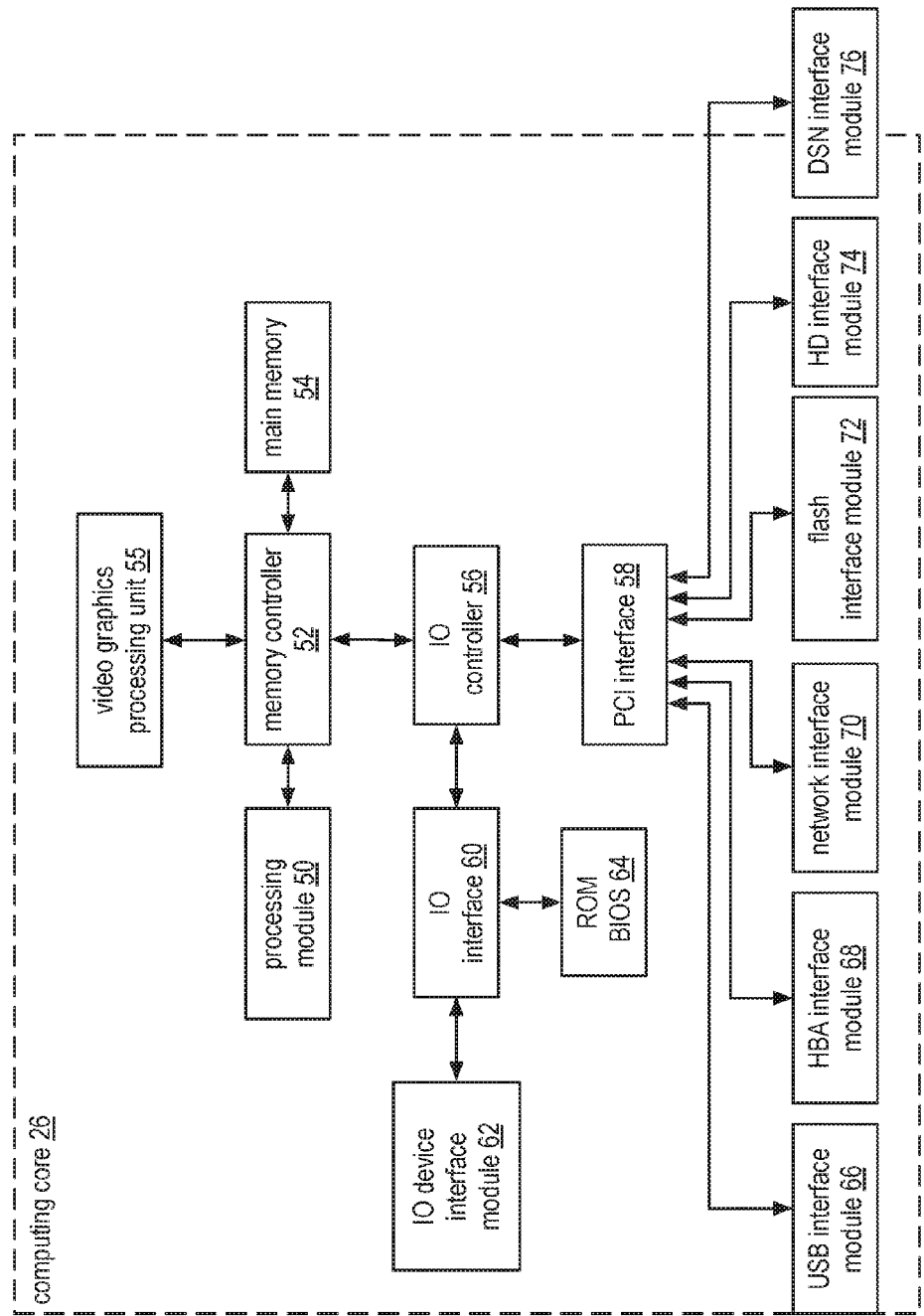
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22. Note that one or more of the vault ID, the data object ID, the revision information, and/or other fields (not shown) may be referred to as a source name. A source name is typically common information for slices names of a plurality of sets of encoded data slices (e.g., encoded data slices of the same data object, multiple data objects, or a portion of a data object).

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
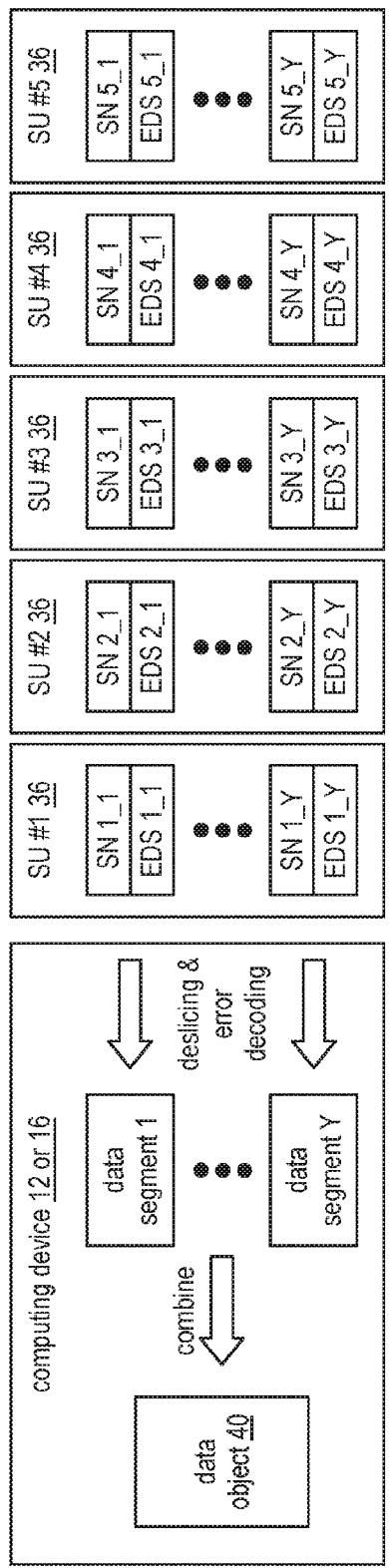
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
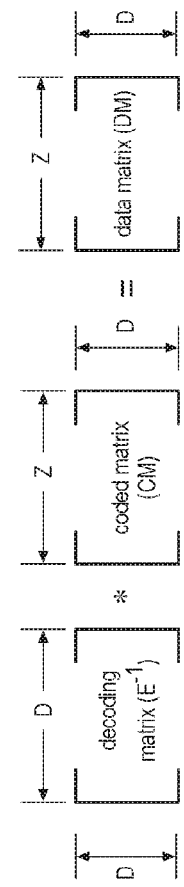
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
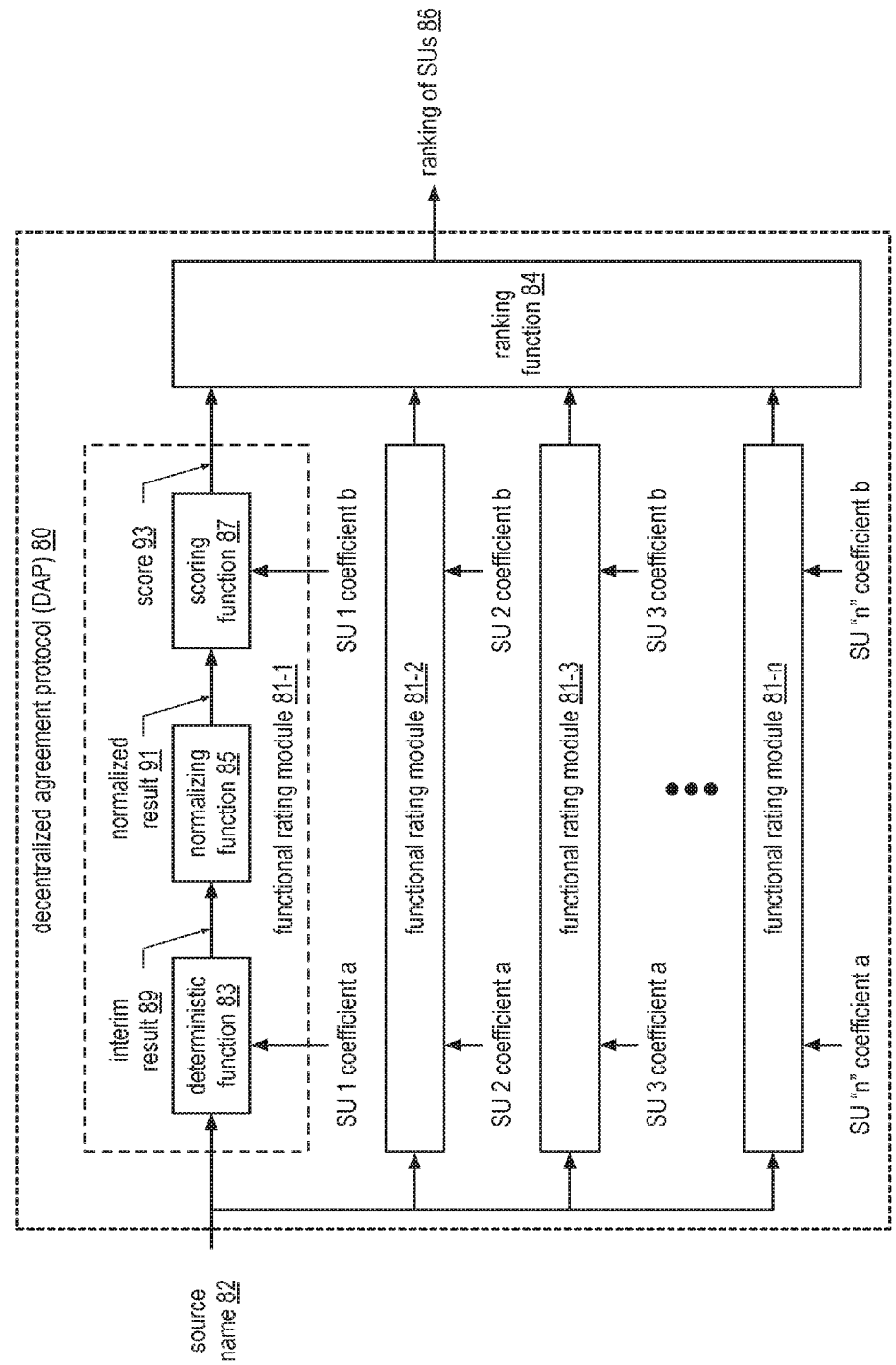
FIG. 9 is a schematic block diagram of an embodiment of a decentralized, or distributed, agreement protocol (DAP) in accordance with the present invention.

FIG. 9 is a schematic block diagram of an embodiment of a decentralized, or distributed, agreement protocol (DAP) 80 that may be implemented by a computing device, a storage unit, and/or any other device or unit of the DSN to determine where to store encoded data slices or where to find stored encoded data slices. The DAP 80 includes a plurality of functional rating modules 81. Each of the functional rating modules 81 includes a deterministic function 83, a normalizing function 85, and a scoring function 87.

Each functional rating module 81 receives, as inputs, a source name 82 (which corresponds to shared information by a plurality of sets of slice names for a plurality of sets of encoded data slices of a data object) and storage unit (SU) coefficients (e.g., a first functional rating module 81-1 receives SU 1 coefficients a and b). Based on the inputs, where the SU coefficients are different for each functional rating module 81, each functional rating module 81 generates a unique score 93 (e.g., an alpha-numerical value, a numerical value, etc.). The ranking function 84 receives the unique scores 93 and orders them based on an ordering function (e.g., highest to lowest, lowest to highest, alphabetical, etc.), to produce a ranking of the storage units (SUs) 86.

As a specific example, the first functional module 81-1 receives the source name 82, which corresponds to data object, a portion of a data object, or multiple data objects and receives SU coefficients for storage unit 1 of the storage units of the DSN. The SU coefficients includes a first coefficient (e.g., "a") and a second coefficient (e.g., "b"). For example, the first coefficient is a unique identifier for the corresponding storage unit (e.g., SU #1's ID for SU 1 coefficient "a") and the second coefficient is a weighting factor for the storage unit. The weighting factors are derived to ensure, over time, data is stored in the storage units in a fair and distributed manner based on the capabilities of the storage units.

For example, the weighting factor includes an arbitrary bias which adjusts a proportion of selections to an associated location such that a probability that a source name will be mapped to that location is equal to the location weight divided by a sum of all location weights for all locations of comparison (e.g., locations correspond to storage units). As a specific example, each storage unit is associated with a location weight based on storage capacity such that, storage units with more storage capacity have a higher location weighting factor than storage units with less storage capacity.

The deterministic function 83, which may be a hashing function, a hash-based message authentication code function, a mask generating function, a cyclic redundancy code function, hashing module of a number of locations, consistent hashing, rendezvous hashing, and/or a sponge function, performs a deterministic function on a combination and/or concatenation (e.g., add, append, interleave) of the source name 82 and the first SU coefficient (e.g., SU 1 coefficient "a") to produce an interim result 89.

The normalizing function 85 normalizes the interim result 89 to produce a normalized interim result 91. For instance, the normalizing function 85 divides the interim result 89 by a number of possible output permutations of the deterministic function 83 to produce the normalized interim result. For example, if the interim result is 4,325 (decimal) and the number of possible output permutations is 10,000, then the normalized result is 0.4325.

The scoring function 87 performs a mathematical function on the normalized result 91 to produce the score 93. The mathematical function may be division, multiplication, addition, subtraction, a combination thereof, and/or any mathematical operation. For example, the scoring function divides the second SU coefficient (e.g., SU 1 coefficient "b") by the negative log of the normalized result (e.g., $e^y = x$ and/or $\ln(x) = y$). For example, if the second SU coefficient is 17.5 and the negative log of the normalized result is 1.5411 (e.g. $e^{(0.4235)}$) the score is 11.3555.

The ranking function 84 receives the scores 93 from each of the function rating modules 81 and orders them to produce a ranking of the storage units 86. For example, if the ordering is highest to lowest and there are five storage units in the DSN, the ranking function evaluates the scores for five storage units to place them in a ranked order.

Figure 10:
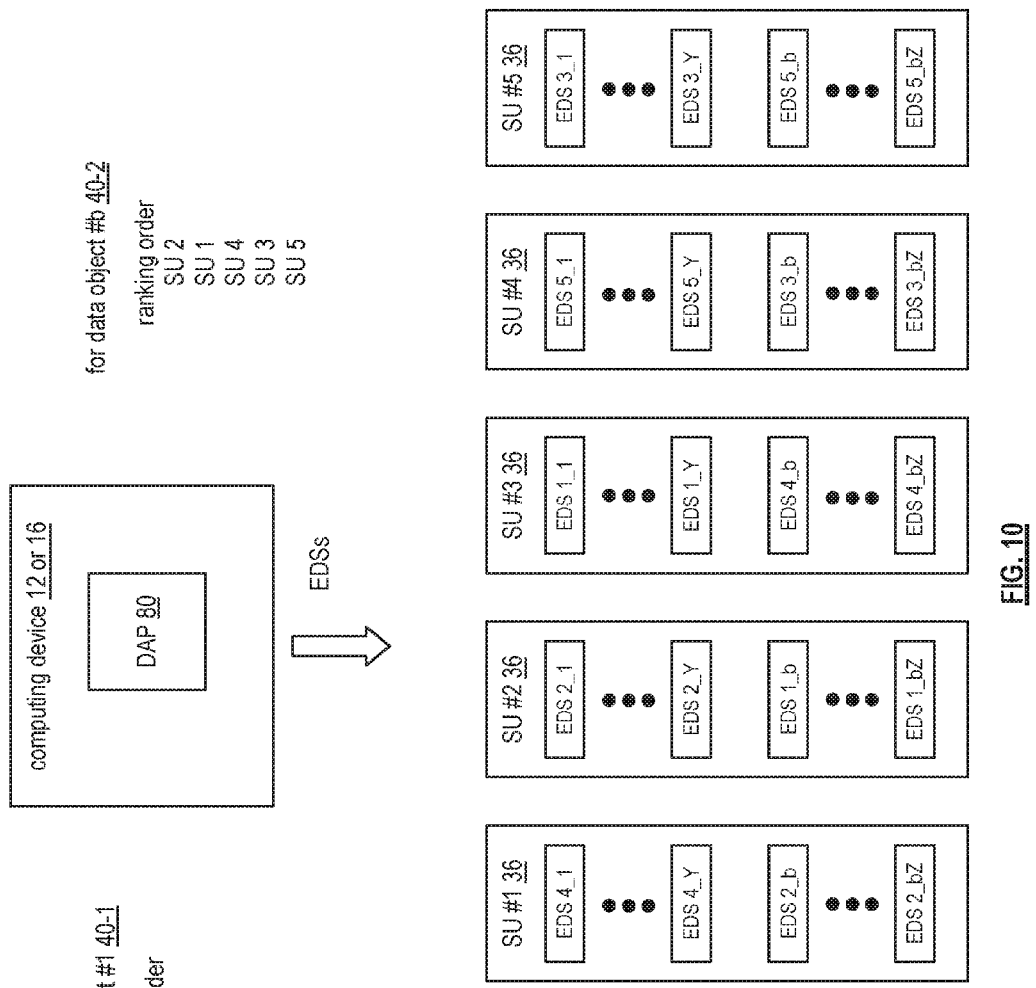
FIG. 10 is a schematic block diagram of an example of storing encoded data slices based on the DAP in accordance with the present invention.

FIG. 10 is a schematic block diagram of an example of storing encoded data slices based on the DAP 80. In this example, a computing device 12-16 executes the DAP to determine where to store encoded data slices for a first data object 40-1 and for another data object 40-2. In this example, the DSN only includes five storage units SU #1 through SU #5. In execution of the DAP 80, as discussed with reference to FIG. 9, the computing device 12-16 generates a ranked ordering for the first data object 40-1 of SU 3, SU 2, SU 5, SU 1, and SU 4. In this ranking, SU 3 has the highest ranking and SU 4 has the lowest ranking.

In accordance with the ranking order for the first data object (which is based on a source name of the first data object), the computing device sends encoded data slices to the storage units. For example, the computing device encodes data object #1 to produce Y (e.g., three) sets of encoded data slices, each set includes five encoded data slices. The computing device sends the first encoded data slice of each of the three sets to storage unit #3, sends the second encoded data slice of each of the three sets to storage unit #2, sends the third encoded data slice of each of the three sets to storage unit #5, sends the fourth encoded data slice of each of the three sets to storage unit #1, and sends the fifth encoded data slice of each of the three sets to storage unit #4.

In accordance with the ranking order for the other data object (which is based on a source name of the other data object), the computing device sends encoded data slices to the storage units. For example, the computing device encodes data object #b to produce Z (e.g., four) sets of encoded data slices, each set includes five encoded data slices. The computing device sends the first encoded data slice of each of the four sets to storage unit #2, sends the second encoded data slice of each of the four sets to storage unit #1, sends the third encoded data slice of each of the four sets to storage unit #4, sends the fourth encoded data slice of each of the four sets to storage unit #3, and sends the fifth encoded data slice of each of the four sets to storage unit #5.

The computing device will continue to use the DAP 80 with the same coefficients while the DSN includes the five storage units. When the DSN expands to include additional storage units, the coefficients for the DAP 80 are updated and additional functional rating modules are added to the DAP; one for each new storage unit added to the DSN.

Figure 11:
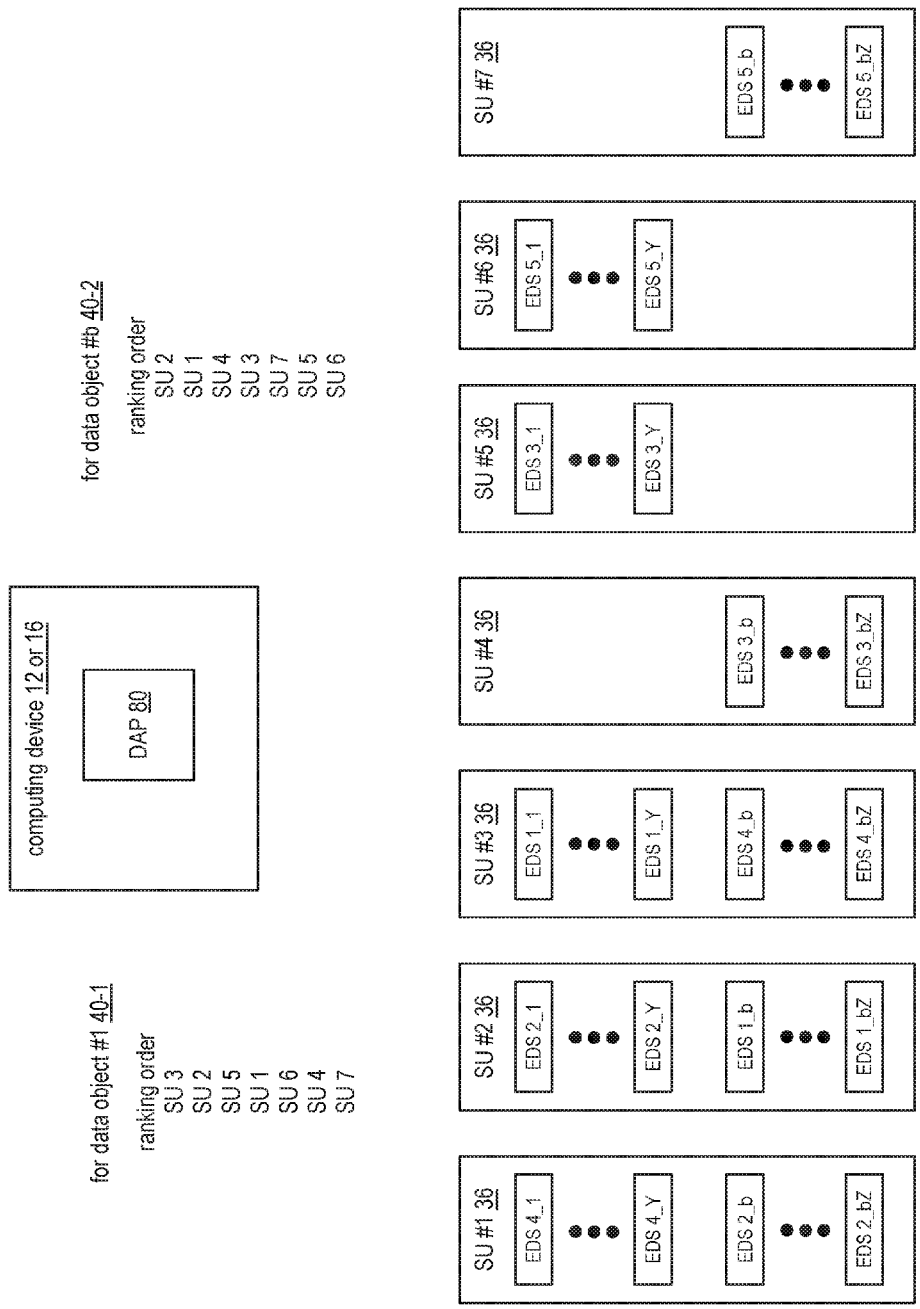
FIG. 11 is a schematic block diagram of another example of storing encoded data slices based on the DAP in accordance with the present invention.

FIG. 11 is a schematic block diagram of another example of storing encoded data slices based on the DAP when two new storage units are added to the DSN of FIG. 10. Since there are new storage units, the DAP 80 is expanded to include seven functional rating modules 81: one for each storage unit in the DSN. Further, the coefficients for each of the functional rating modules are updated. In particular, the second coefficient is updated to reflect a new weighting factor for the existing functional rating modules 81 and new coefficients are created for the new functional rating modules 81.

In this example, the storage units are executing the updated DAP 80 to which encoded data slices are to be transferred and then to transfer them. The computing device 12-16 executes the DAP to determine where the encoded data slices are stored for the first data object 40-1 and for data object "b" 40-2. In this example, the DSN now includes seven storage units SU #1 through SU #7, yet only five are needed to store a set of encoded data slices. In execution of the updated DAP 80, the computing device 12-16 and the storage units all generate the same ranked ordering for the first data object 40-1 of SU 3, SU 2, SU 5, SU 1, SU 6, SU 4, and SU 7 and generate the same ranked ordering for data object 40-2 of SU 2, SU 1, SU 4, SU 3, SU 7, SU 5, and SU 6. The top five storage units are selected to store the encoded data slices.

In accordance with the ranking order for the first data object, SU 4 is now in the sixth ranked position and new storage unit SU 6 is in the fifth ranked position. Since only the top five ranked positions are used, SU 4 transfers it encoded data slices (e.g., EDS 5_1 through EDS 5_Y) to storage unit SU 6. The other encoded data slices stay stored in SU 1, SU 2, SU 3, and SU 5.

In accordance with the ranking order for data object "b", SU 5 is now in the sixth ranked position and new storage unit SU 7 is in the fifth ranked position. Since only the top five ranked positions are used, SU 5 transfers it encoded data slices (e.g., EDS 5_b through EDS 5_bZ) to storage unit SU 7. The other encoded data slices stay stored in SU 1, SU 2, SU 3, and SU 4.

Figure 12:
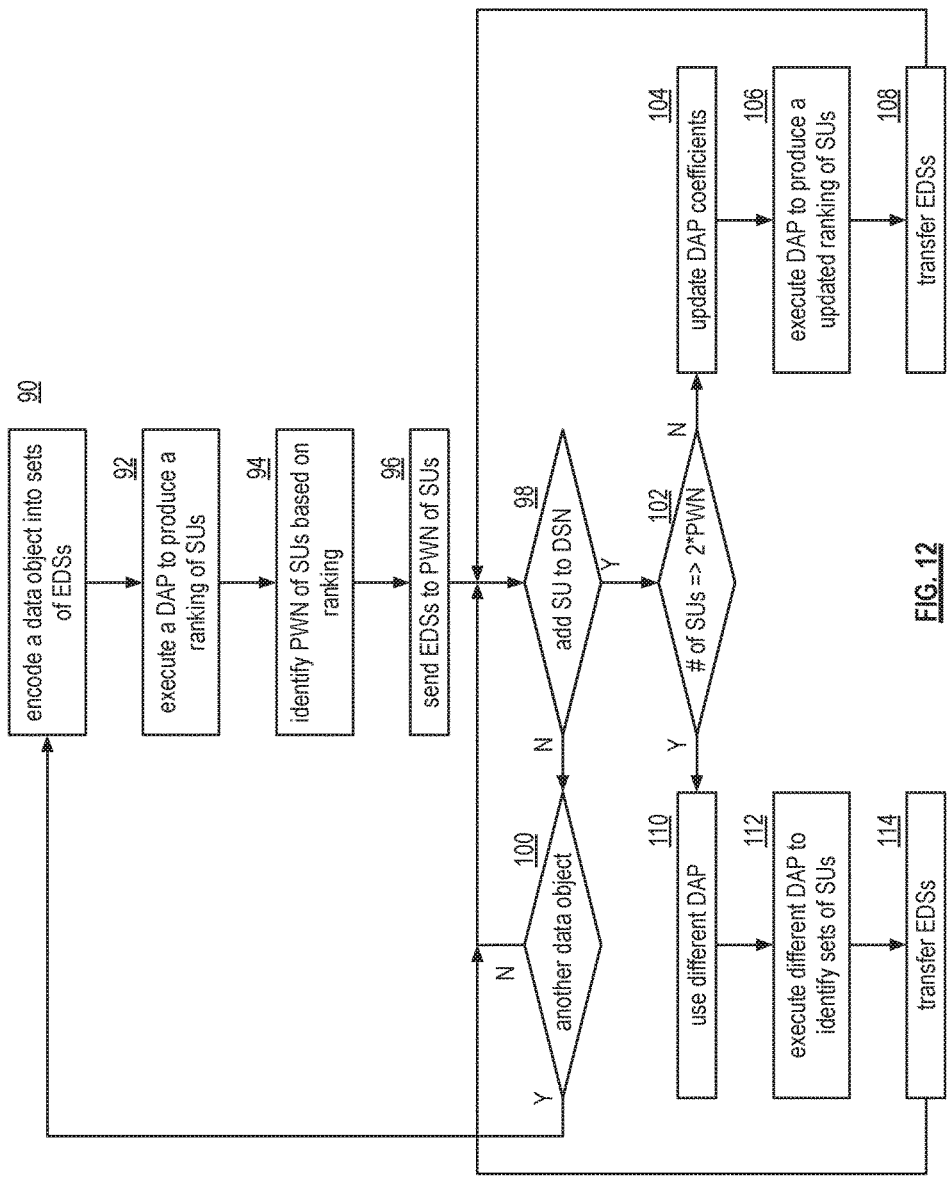
FIG. 12 is a logic diagram of an example of a method of storing encoded data slices based on a DAP in accordance with the present invention.

FIG. 12 is a logic diagram of an example of a method of storing encoded data slices based on a distributed, or decentralized, agreement protocol (DAP). The method, and/or portions thereof, may be executed by a computing device 12-18, a storage unit 36, a managing unit 18, and/or an integrity processing unit 20. A computing device will be used as a representative entity performing the method.

The method begins at step 90 where the computing device encodes a data object in accordance with dispersed storage error encoding parameters to produce a plurality of sets of encoded data slices having a plurality of sets of slice names. For example, the data object has a source name (e.g., as discussed with reference to FIG. 6) and the dispersed storage error encoding parameters include a pillar width number of encoded data slices in a set of encoded data slices, a decode threshold number, a write threshold number, a read threshold number, a segmenting scheme, an error encoding scheme, and a slicing scheme. An example of encoding a data object into a plurality of sets of encoded data slices was discussed with reference to FIGS. 3-5 (e.g., Y sets where EDS 1_1-EDS 5_1 is a first set and EDS 1_Y-EDS5_Y is a last set).

In an embodiment, the dispersed storage error encoding parameters are selected such that the pillar width number equals a number of storage units in the plurality of storage units. For example, of the DSN includes five storage units, then the pillar width number (PWN) is selected to be five.

The method continues at step 92 where the computing device executes a distributed agreement protocol (DAP) using the unique source name and coefficients regarding the storage units of the DSN to produce a ranking of the storage units. For example, the computing device executes the distributed agreement protocol to produce unique scoring values for each storage units. Per the DAP, the computing devices orders the unique scoring values to produce the ranking storage units. An example of this was discussed with reference to FIG. 9. In addition, the computing device select the pillar width number of storage units as the storage units associated with the first pillar width number of scoring values in the ranking of the plurality of storage units. For example, if there are seven storage units in the DSN and the pillar width number is five, then the first five storage units in the ranking will be selected.

The method continues at step 94 where the computing device identifies the pillar width number (PWN) of storage units (SUs) based on the ranking of the storage units. The method continues at step 96 where the computing devices sends the plurality of sets of encoded data slices (EDSs) to the pillar width number of storage units for storage therein. In an embodiment, the computing device sends a first group of encoded data slices to a first storage unit, a second group of encoded data slices to a second storage unit, and so on. The grouping of EDSs corresponds to a position in the set of slices, where the first position is in the first group. Examples of identifying storage units and sending encoded data slices to them were discussed with reference to FIGS. 10 and 11.

The method continues at step 98 where the computing device determines whether a storage unit (SU) has been added to the DSN. If not, the method continues at step 100 where the computing determines whether it has another data object to encoded. If not, the method repeats at step 98.

When the computing device has another data object to encode, the method repeats at step 90 for the other data object. The data object may be encoded using the same dispersed storage error encoding parameters as previously encoded data objects or using different dispersed storage error encoding parameters (e.g., one or more parameters are different).

When the DSN adds one or more storage units (SUs), the method continues at step 102 where the computing device determines whether the number of storage units in the DSN are equal to or greater than twice the pillar width number. If not, the method continues at step 104 where the computing device updates the coefficients of the distributed agreement protocol in accordance with the updated storage units. An example was discussed with reference to FIG. 11.

The method continues at step 106 where the storage units execute the distributed agreement protocol based on the source name and the updated coefficients to produce an updated ranking of the storage units. The method continues at step 108 where one or more storage units transfer at least one encoded data slice to the added storage unit based on the updated ranking of the storage units. An example was discussed with reference to FIG. 11.

When the number of storage units in the DSN are equal to or greater than twice the pillar width number, the method continues at step 110 where the computing device identifies a different distributed agreement protocol to use. The method continues at step 112 where the storage units executes the distributed agreement protocol using a slice identifier and the coefficients regarding the storage units to produce identified set of storage units. The method continues at step 114 where one or more storage units transfer at least one encoded data slice to the added storage unit based on the identified set of storage units.

Figure 13:
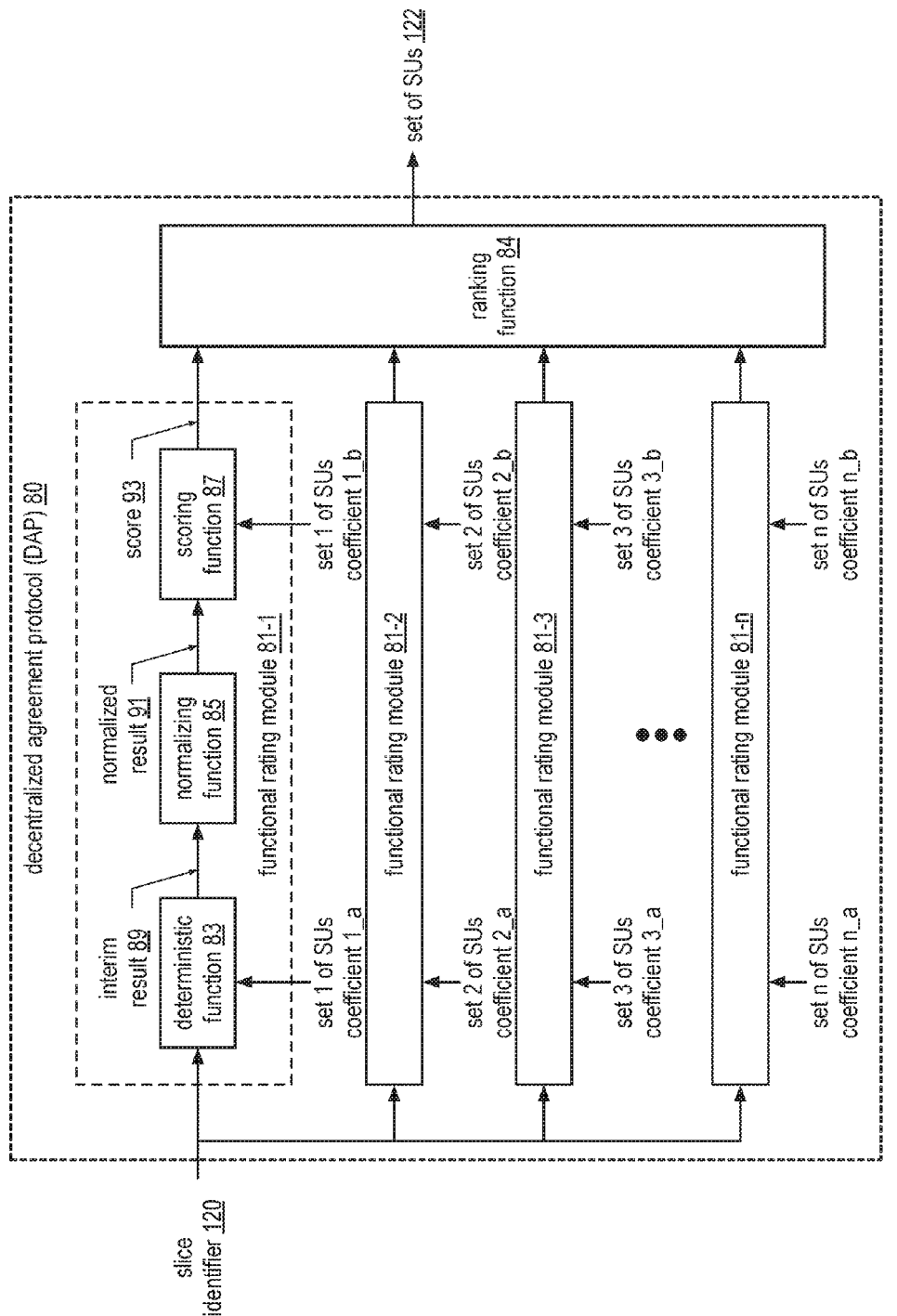
FIG. 13 is a schematic block diagram of an embodiment of a decentralized, or distributed, agreement protocol (DAP) in accordance with the present invention.

FIG. 13 is a schematic block diagram of an embodiment of a decentralized, or distributed, agreement protocol (DAP) for generating identified set of storage units. The DAP 80 is similar to the DAP of FIG. 9, but uses a slice identifier 120 instead of a source name 82, uses coefficients for a set of storage units instead of for individual storage units, and the ranking function 84 outputs an identified set of storage units 122 instead of a storage unit ranking 86. The slice identifier 120 corresponds to a slice name or common attributes of set of slices names. For example, for a set of encoded data slices, the slice identifier 120 specifies a data segment number, a vault ID, and a data object ID, but leaves open ended, the pillar number.

In an example of the operation, each of the functional rating modules 81 generates a score 93 for each set of the storage units based on the slice identifier 120. The ranking function 84 orders the scores 93 to produce a ranking. But, instead of outputting the ranking, the ranking function 84 outputs one of the scores, which corresponds to the identified set of storage units.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a computing device of a dispersed storage network (DSN), the method comprises:
encoding a data object in accordance with dispersed storage error encoding parameters to produce a plurality of sets of encoded data slices having a plurality of sets of slice names, wherein the dispersed storage error encoding parameters includes a pillar width number of encoded data slices in a set of encoded data slices of the plurality of sets of encoded data slices, wherein the data object is associated with a unique source name, and wherein each slice name of the plurality of sets of slice names includes a reference to the unique source name;
executing a distributed agreement protocol using the unique source name and coefficients regarding a plurality of storage units of the DSN to produce a ranking of the plurality of storage units;
identifying the pillar width number of storage units of the plurality of storage units based on the ranking of the storage units, and when the plurality of storage units is less than two times the pillar width number, executing the distributed agreement protocol using the unique source name and the coefficients regarding the plurality of storage units of the DSN to produce the ranking of the plurality of storage units; and when the plurality of storage units is at least two times the pillar width number of storage units, executing the distributed agreement protocol using a slice identifier and the coefficients regarding the plurality of storage units of the DSN to produce identified set of storage units of the plurality of storage units; and
sending the plurality of sets of encoded data slices to the pillar width number of storage units for storage therein.

2. The method of claim 1 further comprises:
executing the distributed agreement protocol to produce a plurality of scoring values for the plurality of storage units, wherein each scoring value of the plurality of scoring values is a unique value, wherein the ranking of the plurality of storage units is based on an ordering of the plurality of scoring values; and
selecting the pillar width number of storage units as the storage units associated with the first pillar width number of scoring values in the ranking of the plurality of storage units.

3. The method of claim 1, wherein the sending the plurality of sets of encoded data slices to the pillar width number of storage units for storage comprises:
sending a first group of encoded data slices to a first storage unit of the pillar width number of storage units, wherein the first group of encoded data slices includes a first encoded data slice of each set of at least some of the plurality of sets of encoded data slices; and
sending a second group of encoded data slices to a second storage unit of the pillar width number of storage units, wherein the second group of encoded data slices includes a second encoded data slice of each set of at least some of the plurality of sets of encoded data slices.

4. The method of claim 1 further comprises:
encoding a second data object in accordance with second dispersed storage error encoding parameters to produce a second plurality of sets of encoded data slices having a second plurality of sets of slice names, wherein the second dispersed storage error encoding parameters includes a second pillar width number of encoded data slices in a set of encoded data slices of the second plurality of sets of encoded data slices, wherein the second data object is associated with a second unique source name, and wherein each slice name of the second plurality of sets of slice names includes a reference to the second unique source name;
executing the distributed agreement protocol using the second unique source name and the coefficients regarding the plurality of storage units of the DSN to produce a second ranking of the plurality of storage units;
identifying the second pillar width number of storage units of the plurality of storage units based on the second ranking of the storage units; and
sending the second plurality of sets of encoded data slices to the second pillar width number of storage units for storage therein.

5. The method of claim 1 further comprises:
when a storage unit is added to the plurality of storage units to produce an updated plurality of storage units, updating the coefficients of the distributed agreement protocol in accordance with the updated plurality of storage units;

executing, by each storage unit of the updated plurality of storage units, the distributed agreement protocol based on the unique source name and the updated coefficients to produce an updated ranking of the updated plurality of storage units; and transferring, by at least one storage unit of the pillar width number of storage units, at least one encoded data slice to the added storage unit based on the updated ranking of the updated plurality of storage units.

6. The method of claim 1 further comprises:
selecting the dispersed storage error encoding parameters such that the pillar width number equals a number of storage units in the plurality of storage units.

7. A computer readable memory comprises:
a first memory element that stores operational instructions that, when executed by a computing device, causes the computing device to:
encode a data object in accordance with dispersed storage error encoding parameters to produce a plurality of sets of encoded data slices having a plurality of sets of slice names, wherein the dispersed storage error encoding parameters includes a pillar width number of encoded data slices in a set of encoded data slices of the plurality of sets of encoded data slices, wherein the data object is associated with a unique source name, and wherein each slice name of the plurality of sets of slice names includes a reference to the unique source name;
a second memory element that stores operational instructions that, when executed by the computing device, causes the computing device to:
execute a distributed agreement protocol using the unique source name and coefficients regarding a plurality of storage units of a dispersed storage network (DSN) to produce a ranking of the plurality of storage units; and
identify the pillar width number of storage units of the plurality of storage units based on the ranking of the storage units, and
when the plurality of storage units is less than two times the pillar width number, executing the distributed agreement protocol using the unique source name and the coefficients regarding the plurality of storage units of the DSN to produce the ranking of the plurality of storage units; and when the plurality of storage units is at least two times the pillar width number of storage units, executing the distributed agreement protocol using a slice identifier and the coefficients regarding the plurality of storage units of the DSN to produce identified set of storage units of the plurality of storage units; and
a third memory element that stores operational instructions that, when executed by the computing device, causes the computing device to:
send the plurality of sets of encoded data slices to the pillar width number of storage units for storage therein.

8. The computer readable memory of claim 7, wherein the second memory element further stores operational instructions that, when executed by the computing device, causes the computing device to:
executing the distributed agreement protocol to produce a plurality of scoring values for the plurality of storage units, wherein each scoring value of the plurality of scoring values is a unique value, wherein the ranking of the plurality of storage units is based on an ordering of the plurality of scoring values; and
selecting the pillar width number of storage units as the storage units associated with the first pillar width number of scoring values in the ranking of the plurality of storage units.

9. The computer readable memory of claim 7, wherein the third memory element further stores operational instructions that, when executed by the computing device, causes the computing device to send the plurality of sets of encoded data slices to the pillar width number of storage units for storage by:
sending a first group of encoded data slices to a first storage unit of the pillar width number of storage units, wherein the first group of encoded data slices includes a first encoded data slice of each set of at least some of the plurality of sets of encoded data slices; and
sending a second group of encoded data slices to a second storage unit of the pillar width number of storage units, wherein the second group of encoded data slices includes a second encoded data slice of each set of at least some of the plurality of sets of encoded data slices.

10. The computer readable memory of claim 7 further comprises:
the first memory element further stores operational instructions that, when executed by the computing device, causes the computing device to:
encode a second data object in accordance with second dispersed storage error encoding parameters to produce a second plurality of sets of encoded data slices having a second plurality of sets of slice names, wherein the second dispersed storage error encoding parameters includes a second pillar width number of encoded data slices in a set of encoded data slices of the second plurality of sets of encoded data slices, wherein the second data object is associated with a second unique source name, and wherein each slice name of the second plurality of sets of slice names includes a reference to the second unique source name;
the second memory element further stores operational instructions that, when executed by the computing device, causes the computing device to:
execute the distributed agreement protocol using the second unique source name and the coefficients regarding the plurality of storage units of the DSN to produce a second ranking of the plurality of storage units; and
identify the second pillar width number of storage units of the plurality of storage units based on the second ranking of the storage units; and
the third memory element further stores operational instructions that, when executed by the computing device, causes the computing device to:
send the second plurality of sets of encoded data slices to the second pillar width number of storage units for storage therein.

11. The computer readable memory of claim 7 further comprises:
a fourth memory element that stores operational instructions that, when executed by the computing device, causes the computing device to:
when a storage unit is added to the plurality of storage units to produce an updated plurality of storage units, update the coefficients of the distributed agreement protocol in accordance with the updated plurality of storage units;

a fifth memory element that stores operational instructions that, when executed by a storage unit of the plurality of storage units, causes the storage unit to:

execute the distributed agreement protocol based on the unique source name and the updated coefficients to produce an updated ranking of the updated plurality of storage units; and transfer at least one encoded data slice to the added storage unit based on the updated ranking of the updated plurality of storage units.

12. The computer readable memory of claim 7, wherein the first memory element further stores operational instructions that, when executed by the computing device, causes the computing device to:

selecting the dispersed storage error encoding parameters such that the pillar width number equals a number of storage units in the plurality of storage units.

* * * * *